United States Patent
Huang et al.

(10) Patent No.: US 10,063,132 B1
(45) Date of Patent: Aug. 28, 2018

(54) OVER-CURRENT PROTECTION CIRCUIT

(71) Applicant: Powerventure Semiconductor Limited, London (GB)

(72) Inventors: Chi-Chia Huang, Hsinchu (TW); Yu Ta Lin, New Taipei (TW)

(73) Assignee: Dialog Semiconductor (UK) Limited, London (GB)

( * ) Notice: Subject to any disclaimer, the term of this patent is extended or adjusted under 35 U.S.C. 154(b) by 0 days.

(21) Appl. No.: 15/444,984

(22) Filed: Feb. 28, 2017

(51) Int. Cl.
| | | |
|---|---|---|
| *H02H 7/122* | (2006.01) | |
| *H02M 1/32* | (2007.01) | |
| *H02M 3/158* | (2006.01) | |
| *H03K 3/356* | (2006.01) | |
| *H02M 1/00* | (2006.01) | |

(52) U.S. Cl.
CPC ............. *H02M 1/32* (2013.01); *H02M 3/158* (2013.01); *H03K 3/356017* (2013.01); *H02M 2001/0009* (2013.01)

(58) Field of Classification Search
CPC ............................... H02M 3/156; H02M 1/32
USPC ...................... 323/282–290, 351; 363/50, 55
See application file for complete search history.

(56) References Cited

U.S. PATENT DOCUMENTS

| | | | | | |
|---|---|---|---|---|---|
| 8,716,988 | B2* | 5/2014 | Yabuzaki | ................... | G05F 1/70 323/266 |
| 8,841,897 | B2* | 9/2014 | Williams | ............... | G05F 1/5735 323/285 |
| 2002/0060559 | A1* | 5/2002 | Umemoto | ............. | H02M 3/156 323/282 |
| 2007/0019450 | A1* | 1/2007 | Tiew | ...................... | H02M 3/156 363/98 |
| 2008/0231244 | A1* | 9/2008 | Yamada | .................. | H02M 1/32 323/282 |
| 2012/0119718 | A1* | 5/2012 | Song | .................... | H02M 3/1588 323/282 |
| 2013/0162237 | A1* | 6/2013 | Huang | .................. | H02M 3/158 323/311 |

OTHER PUBLICATIONS

"High-Efficiency Operation of High-Frequency DC/DC Conversion for Next-Generation Microprocessors," by Shuo Chen et al., The 29th Annual Conference of the IEEE Industrial Electronics Society, 2003, IECON '03, Nov. 2-6, 2003, pp. 30-35, vol. 1.
"A Monolithic Current-Mode Buck Converter With Advanced Control and Protection Circuits," by Feng-Fei Ma et al., IEEE Transactions on Power Electronics, vol. 22, No. 5, Sep. 2007, pp. 1836-1846.

* cited by examiner

*Primary Examiner* — Alex Torres-Rivera
(74) *Attorney, Agent, or Firm* — Saile Ackerman LLC; Stephen B. Ackerman

(57) ABSTRACT

A negative over-current protection circuit for a switching inverting converter is provided. The circuit contains an energy-storing element coupled to a power switch via a switching node, a current sensor adapted to sense a current at the switching node and to convert the current into a voltage. The circuit also contains a converter adapted to convert the voltage into a first current associated with a first domain, a level shifter adapted to convert the first current into a second current associated with a second domain and a current comparator adapted to compare the second current with a reference current and to provide a logic signal based on the comparison. A method of protecting a switching converter from an over-current is also provided.

23 Claims, 10 Drawing Sheets

| NOC DC threshold (A) | | | | |
|---|---|---|---|---|
| | Min | Max | Mean | 3-sgima |
| With SDA | −1.775 | −1.335 | −1.524 | 16.45% |
| W/O SDA | −1.775 | −1.335 | −1.524 | 16.45% |

FIG. 8a

| NOC transient threshold (A) | | | | |
|---|---|---|---|---|
| | Min | Max | Mean | 3-sgima |
| With SDA | −1.746 | −1.324 | −1.508 | 16.29% |
| W/O SDA | −1.842 | −1.406 | −1.593 | 16.02% |

FIG. 8b

| NOC delay (ns) | | | |
|---|---|---|---|
| | Min | Max | Mean |
| With SDA | −9.7 | 12 | 1.25 |
| W/O SDA | 9.8 | 24.1 | 15.9 |

FIG. 8c

| NOC DC threshold (mA) | | | | |
|---|---|---|---|---|
|  | Min | Max | Mean | 3-sgima |
| With SDA | -755 | -475 | -604.5 | 25.77% |
| W/O SDA | -755 | -475 | -604.5 | 25.77% |

FIG. 9a

| NOC transient threshold (mA) | | | | |
|---|---|---|---|---|
|  | Min | Max | Mean | 3-sgima |
| With SDA | -759.1 | -480.4 | -615.2 | 25.85% |
| W/O SDA | -824.9 | -540.4 | -674.4 | 23.02% |

FIG. 9b

| NOC delay (ns) | | | |
|---|---|---|---|
|  | Min | Max | Mean |
| With SDA | -5.92 | 9.89 | 3.15 |
| W/O SDA | 11.95 | 21.82 | 16.68 |

FIG. 9c

| NOC DC threshold (mA) | | | | |
|---|---|---|---|---|
|  | Min | Max | Mean | 3-sgima |
| With SDA | -755 | -475 | -604.5 | 25.77% |
| W/O SDA | -755 | -475 | -604.5 | 25.77% |

FIG. 11a

| NOC transient threshold (mA) | | | | |
|---|---|---|---|---|
|  | Min | Max | Mean | 3-sgima |
| With SDA | -772.3 | -494.6 | -630.3 | 24.48% |
| W/O SDA | -824.9 | -540.4 | -674.4 | 23.02% |

FIG. 11b

| NOC delay (ns) | | | |
|---|---|---|---|
|  | Min | Max | Mean |
| With SDA | -0.17 | 14.2 | 7.37 |
| W/O SDA | 11.95 | 21.82 | 16.68 |

OVER-CURRENT PROTECTION CIRCUIT

TECHNICAL FIELD

The present disclosure relates to a protection circuit and methods for protecting a switching converter from an over-current. In particular, the present invention relates to a negative over-current protection circuit for an inverting converter.

BACKGROUND

Over-current protection circuits can be categorized into systems based on voltage comparison and current comparison. Over-current protection circuits based on voltage comparison have a slow response speed or a relatively large power consumption. To address this issue protection circuits based on current comparison have been proposed.

For instance, an over-current protection circuit has been described in the publication titled "A monolithic current-mode buck converter with advanced control and protection circuits". IEEE Transactions on Power Electronics, pp. 1836-1846, Vol. 22, No. 5, September 2007.

The protection circuit has a current sensing circuit and a comparator described with respect to FIGS. 7 and 9(b) of the above-mentioned application. The current sensing circuit is used to generate a current Iz that is inversely proportional to the drain current of a power switch M1 directly connected to the switching node of a buck converter. The power switch M1 is connected to a CCII current conveyor via a second power switch M2 of same type as M1 but having different aspect ratio. The CCII current conveyor regulates the drain voltage of M2 to be the same as that of M1. Hence, the biasing condition of M2 is almost the same as that of M1, and the current Iz is almost inversely proportional to the drain current of M1. The comparator circuit then compares Iz against a reference current. If Iz is larger than the reference current, the comparator will output a logic high signal indicating an over-current condition.

The comparator circuit described above is fast and consumes little energy, however such a circuit is not suitable for negative over-current protection. In particular, such a circuit is not suitable for protecting an inverting boost converter. The current circuit is designed to operate with a positive power domain (0V~6V); whereas for an inverting boost converter, the current sensing circuit would need to operate with a negative domain (−6V~0V). In addition, in an inverting boost converter, the voltage at the switching node can swing between relatively large negative and positive value, for example −6V to +6V, therefore applying the sensing circuit of the prior art to an inverting boost converter would stress the current conveyor.

In addition, the comparator circuit of the prior art is limited in that one can only reduce the comparator delay by increasing the sensing current and the quiescent current of the current conveyor circuit; which increases power consumption.

SUMMARY

It is an object of the invention to address one or more of the above-mentioned limitations.

According to a first aspect of the disclosure, there is provided a current protection circuit for use with a switching converter comprising an energy-storing element coupled to a power switch via a switching node, the protection circuit comprising a current sensor adapted to sense a current at the switching node and to convert the current into a voltage; a converter adapted to convert the voltage into a first current associated with a first domain; a level shifter adapted to convert the first current into a second current associated with a second domain; a current comparator adapted to compare the second current with a reference current and to provide a logic signal based on the comparison.

For example, the protection circuit may be a negative over-current protection circuit. The logic signal can be used to protect the power switch from a negative over-current.

Optionally, the reference current is proportional to a threshold current through the power switch.

Optionally, the first domain may be a negative domain, and the second domain may be a positive domain.

Optionally, the protection circuit comprises a regulator coupled to the current sensor and to the convertor.

Optionally, the protection circuit comprises a slope-detector adapted to detect a slope of the current at the switching node and adjust the reference current based on the slope.

Optionally, the slope detector may be adapted to detect the slope of the current at the switching node by detecting a variation of the first current.

Optionally, the slope detector may be adapted to decrease the reference current when the slope is negative and to increase the reference current when the slope is positive.

Optionally, the current sensor comprises a first switch coupled to a second switch; wherein the second switch is coupled to the switching node and wherein the first switch is coupled to the first domain.

Optionally, the second switch has an aspect ratio that is larger than the aspect ratio of the first switch. For example, the second switch may have an aspect ratio ten times larger than the aspect ratio of the first switch.

Optionally, the converter may be adapted to provide an output voltage and to dynamically maintain the output voltage substantially identical to the voltage provided by the current sensor.

Optionally, the converter comprises a first current mirror coupled to a second current mirror; wherein the first current mirror comprises a first switch coupled to the current sensor and a second switch coupled to the level shifter via a third switch.

Optionally, the level shifter comprises a first current mirror, and the current comparator comprises a second current mirror, and the slope detector is adapted to adjust the reference current by controlling a gate voltage of the second current mirror based on a gate voltage of the first current mirror.

Optionally, the first current mirror of the level shifter comprises a first switch coupled to the converter via a fourth switch, and a second switch coupled to the current comparator.

Optionally, the current comparator comprises a comparator with hysteresis coupled to the second current mirror of the comparator; wherein the second current mirror comprises a first switch coupled to the comparator with hysteresis and a second switch coupled to a current generator.

Optionally, the slope-detector comprises a first capacitive element coupled to a second capacitive element.

Optionally, the slope-detector comprises a first capacitive element coupled to a second capacitive element; wherein the first capacitive element has a first terminal coupled to a gate of the first current mirror of the level shifter and a second terminal is coupled to a gate of the second current mirror of the comparator.

Optionally, the second capacitive element comprises an array of unit capacitors in which each unit capacitor is connected to ground through a switch.

According to a second aspect of the disclosure there is provided a power circuit comprising a switching converter comprising an energy-storing element coupled to a power switch via a switching node; and a current protection circuit coupled to the switching converter; the current protection circuit comprising a current sensor adapted to sense a current at the switching node and to convert the current into a voltage; a converter adapted to convert the voltage into a first current associated with a first domain; a level shifter adapted to convert the first current into a second current associated with a second domain; and a current comparator adapted to compare the second current with a reference current and to provide a logic signal based on the comparison.

According to a third aspect of the disclosure there is provided a method of protecting a switching converter from an over-current, the switching converter comprising an energy-storing element coupled to a power switch via a switching node, the method comprising sensing a current at the switching node; converting the current at the switching node into a voltage; converting the voltage into a first current associated with a first domain; converting the first current into a second current associated with a second domain; comparing the second current with a reference current and providing a logic signal based on the comparison to protect the switching converter.

For example, sensing the current could include sensing a current proportional to the current at the switching node.

Optionally, the first domain may be a negative domain, and the second domain may be a positive domain.

Optionally, the method comprises detecting a slope of the current at the switching node and adjusting the reference current based on the slope.

Optionally, the method comprises detecting the slope of the current at the switching node by detecting a variation of the first current.

Optionally, the method comprises decreasing the reference current when the slope is negative and increasing the reference current when the slope is positive.

BRIEF DESCRIPTION OF THE DRAWINGS

The invention is described in further detail below by way of example and with reference to the accompanying drawings, in which:

FIGS. 8a, 8b, 8c are tables listing NOC thresholds and delay values obtained with and without SDA;

FIGS. 9a, 9b, 9c are tables listing other NOC thresholds and delay values obtained with and without SDA;

FIGS. 11a, 11b, 11c are tables listing yet other NOC thresholds and delay values obtained with and without SDA.

Description FIG. 1 illustrates the output stage of an inverting boost converter according to the prior art.

The converter includes a high-side power switch Mhs 110 coupled to a low-side power switch Mls 120 via a switching node Lx. The high-side power switch 110 has a first terminal connected to a positive voltage Vsys and another terminal connected to LX. The low-side power switch 120 has a first terminal connected to Lx and another terminal connected to an inverting output, negative voltage Vneg. A load, not shown, may be coupled to the inverting output. In this example, the high-side power switch 110 is a PMOS and the low-side power switch 120 is an NMOS. The switching node is coupled to an inductor Lout 130.

Figure 1:
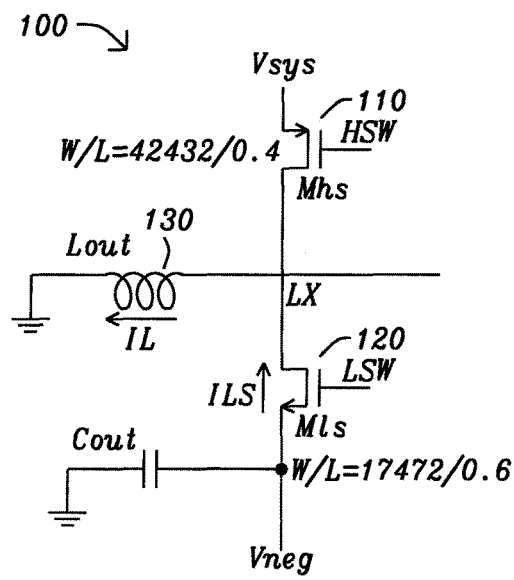
FIG. 1 is a diagram of the output stage of a conventional inverting boost converter.
Figure 2:
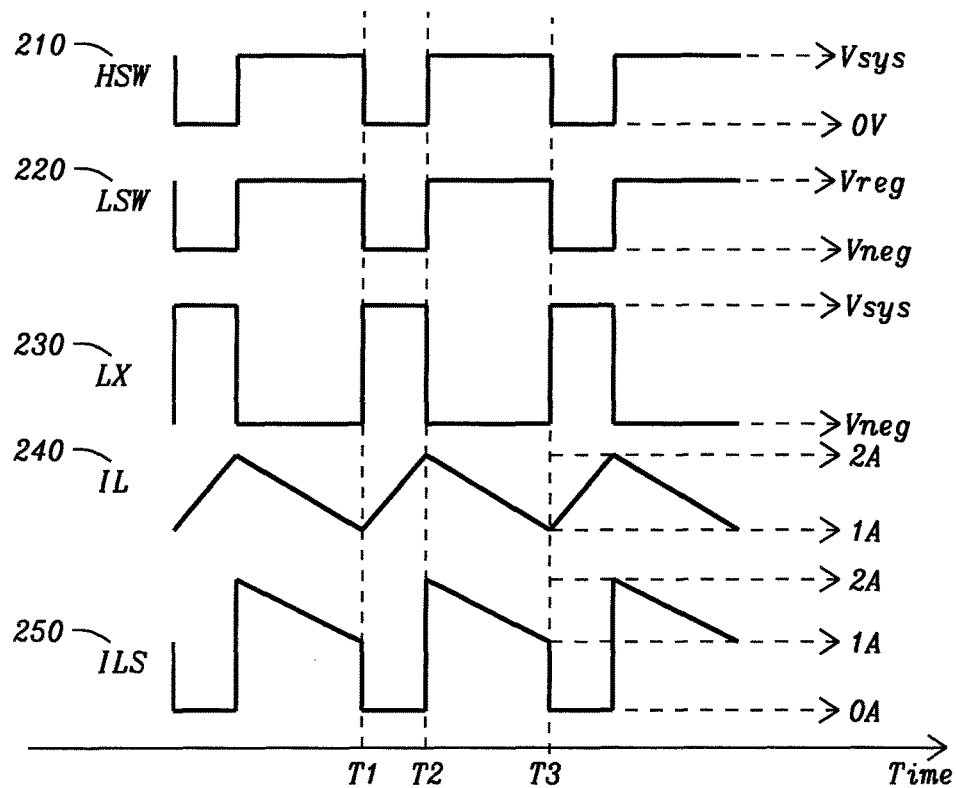
FIG. 2 is a timing chart illustrating the working of the circuit of FIG. 1.

FIG. 2 shows a timing chart illustrating the working of the circuit of FIG. 1. FIG. 2 includes the waveform of the high-side power switch gate control signal HSW 210; the low-side power switch gate control signal LSW 220; the voltage 230 at the switching node LX; the inductor current IL 240 through the inductor 130; the current ILS 250 through the low-side power switch 120.

Between the times T1 and T2, the high-side power switch 110 is turned on and the low-side power switch 120 is turned off. During this time the inductor current IL 240 increases.

Between the times T2 and T3, the high-side power switch 110 is turned off and the low-side power switch 120 is turned on. During this time, the currents IL 240 and ILS 250 are both decreasing, following the same trend.

The minimum values of the currents ILS and IL depend on a load current (not shown) connected to inverting output Vneg. For example, under a load current of 1.5 A, ILS and IL will always be positive, as illustrated in FIG. 2. When the load current decreases, both ILS and IL will decrease. When there is no-load, IL is positive for about one half cycles and negative for another half cycle if operating under continuous conduction mode.

Figure 3:
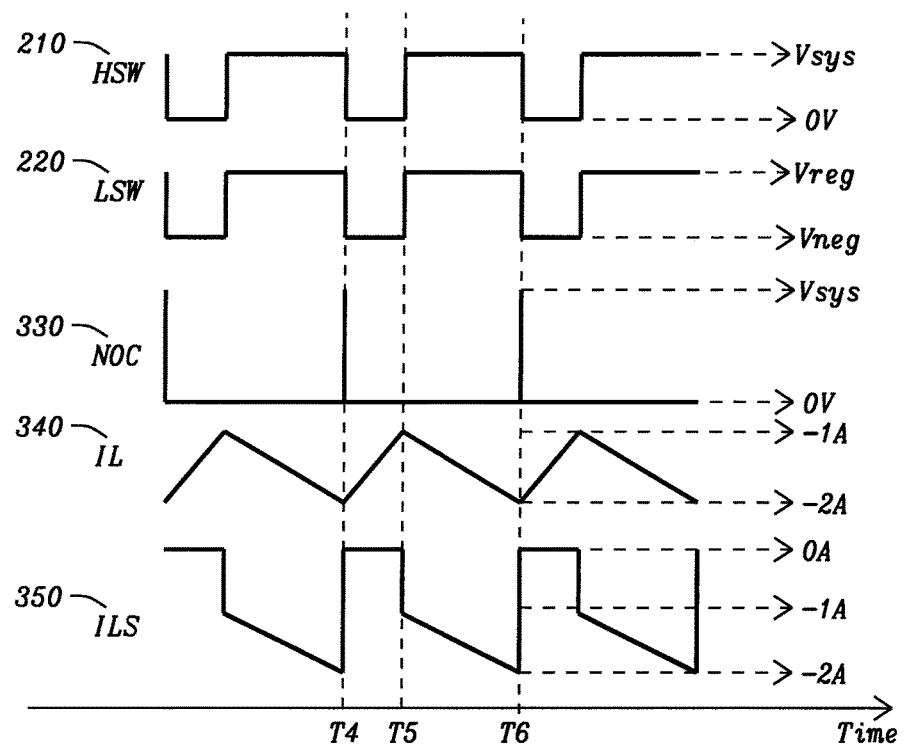
FIG. 3 is a timing chart illustrating the Dynamic Voltage Control DVC procedure using the circuit of FIG. 1.

FIG. 3 is a timing chart illustrating a Dynamic Voltage Control DVC procedure using the circuit of FIG. 1. FIG. 3 includes the gate control signal HSW 210 of the high-side power switch; gate control signal LSW 220 of the low-side power switch; a negative over-current NOC signal 330, the inductor current IL 340 through inductor 130; the current ILS 350 through the low-side power switch. During DVC, the voltage Vneg may vary between two negative values for example between −6V and −5V. If the slew rate of the DVC is high, then the current ILS may always be negative, as shown with respect to waveform 350.

Before the time T4, the voltage Vneg is regulated with respect to a reference voltage Vref not shown. At time T4, the DVC procedure begins and the reference voltage Vref decreases with a predefined slew rate, for example a slew rate of 1 V/ms. A control loop, not shown in FIG. 1, is used to discharge Vneg as fast as possible such that Vneg can track Vref. The discharging path is from Vneg to ground, and the discharging current includes the load current and ILS. When the slew rate is fast, there is no control of ILS, hence ILS will keep decreasing to a very negative value until the inductor Lout gets damaged.

The negative over-current, NOC, signal is used to limit the current ILS to a threshold value. In the present example, the NOC threshold is set to a value of −2 A. Hence, when ILS reaches −2 A, the NOC signal 330 goes high, for example the NOC signal is set to a logic 1. When the NOC signal 330 is high, the low-side switch 120 turns off and the high-side switch 110 turns on. After a short period, ILS goes to zero and the NOC signal goes low, for example the NOC signal is set to a logic zero. On the other hand, the high-side switch 110 will stay on for a fixed duration called the minimum on-time. When the minimum on-time expires, the high-side switch 110 turns off and the low-side switch 120 turns on, ILS increases again and repeats the cycle.

Figure 4:
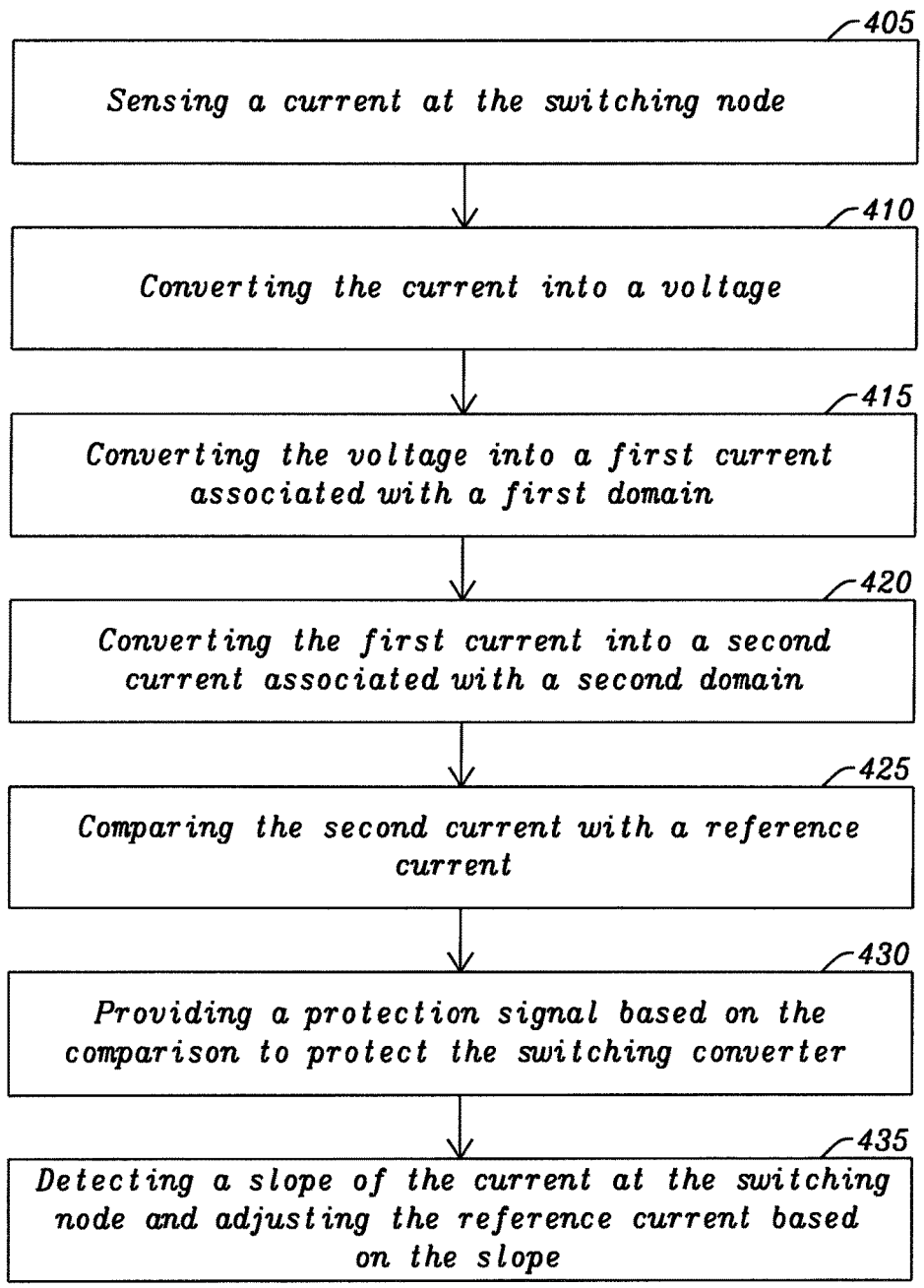
FIG. 4 is a method for providing a negative over-current signal to protect a switching circuit from a negative over-current.

FIG. 4 illustrates a method for providing a NOC signal to protect a switching circuit from an overcurrent, for example a negative overcurrent.

At step 405, a current is sensed at the switching node. At step 410, the current at the switching node is converted into a voltage. At step 415, the voltage is converted into a first current associated with a first domain. At step 420, the first current is converted into a second current associated with a second domain. For example, the first domain may be a negative domain and the second domain may be a positive domain. At step 425, the second current is compared with a reference current. At step 430 a protection signal is provided based on the comparison to protect the switching converter.

Optionally, at step 435, a slope of the inductor current is detected and the reference current is adjusted based on the slope. For example, if the slope of the inductor current is negative then the reference current is decreased. Conversely, if the slope of the inductor current is positive then the reference current is increased. So, if the inductor current decreases rapidly, then the NOC signal is triggered at an early point in time.

Figure 5:
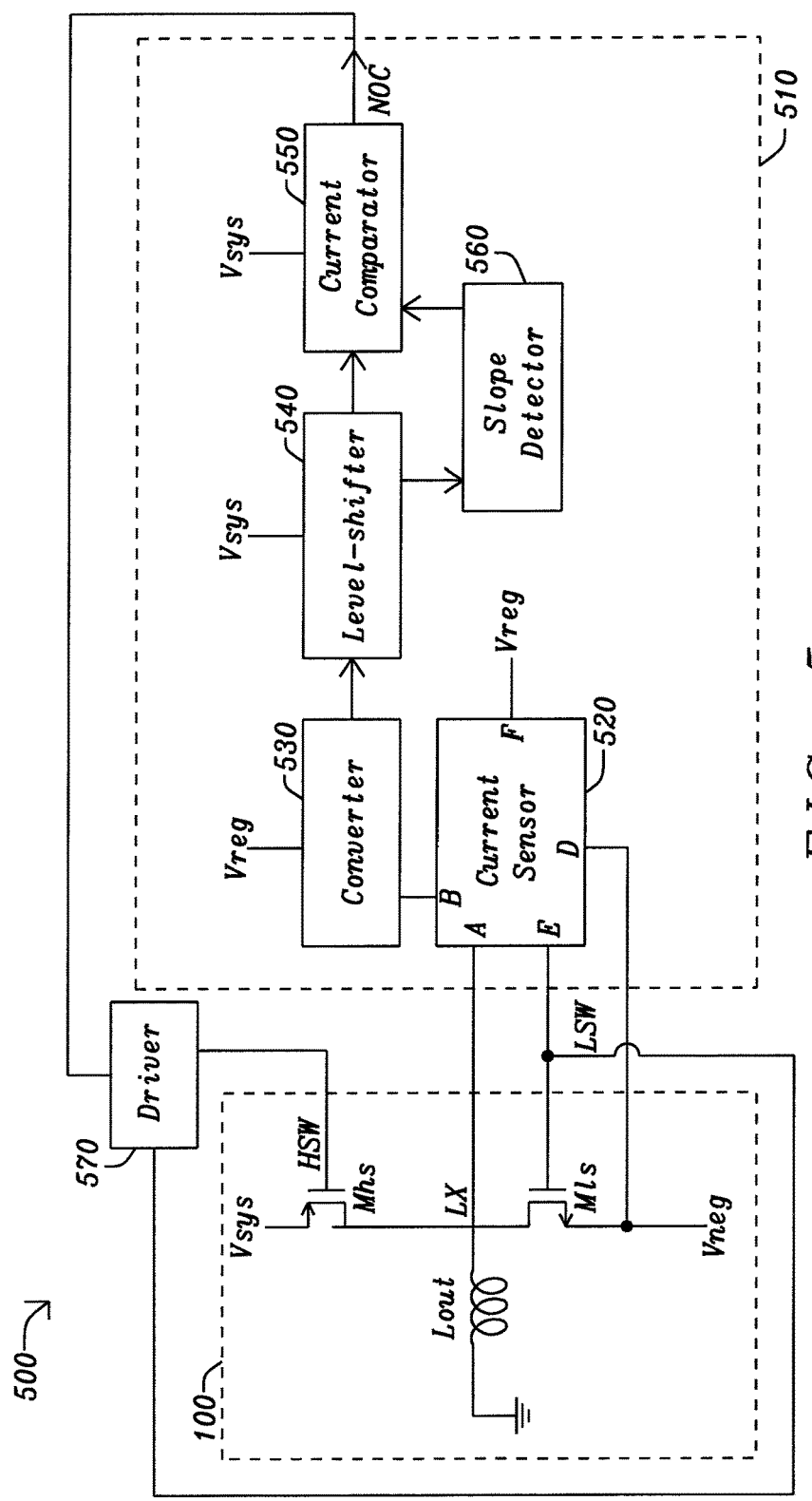
FIG. 5 is a negative over current protection circuit coupled to an inverting boost converter.

FIG. 5 illustrates an inverting boost converter coupled to a negative over current NOC protection circuit 510 for implementing the method of FIG. 4. The protection circuit 510 comprises a current sensor 520, a converter 530, a level-shifter 540, a current comparator 550 and a regulator not shown. In addition, the protection circuit may be provided with a slope detector 560.

The current sensor 520 has an input A coupled to the switching node LX of the converter 100 and an output B coupled to the converter 530. The current sensor has also an input D to receive a first voltage Vneg, an input E to receive a logic signal and input F to receive another voltage from a regulator Vreg. The current sensor 520 is adapted to sense the current of the converter 100 at the switching node and to convert the converter current into a voltage Vsensor at node B. The voltage Vsensor is proportional to the voltage at the switching node.

The converter 530 has an input coupled to the current sensor 520 for receiving the voltage Vsensor at node B, and an output for providing a mirror voltage Vsensor_mir coupled to the level-shifter 540. The converter 530 is adapted to regulate Vsensor_mir with Vsensor by sourcing a current Isense associated with a first domain. In this example, the first domain is a negative power domain. The converter 530 is adapted to dynamically maintain Vsensor_mir substantially identical to the voltage Vsensor.

The level shifter 540, also referred to as current mode level shifter, has an input coupled to the converter 530 and an output coupled to the current comparator 550. The level shifter 550 is adapted to convert the first current provided by the converter 530 to a second current associated with a second domain. In this example the second domain is a positive domain.

The current comparator 550 has an input coupled to the level shifter 540 and an output for providing a logic signal, also referred to as NOC signal. The current comparator 550 is adapted to compare the second current provided by the level-shifter 540 with a reference current and to provide the logic signal based on the comparison. The current comparator 550 is coupled to a driver 570 for controlling the high-side power switch and the low-side power switch.

Such a protection circuit may be used with an inverting boost converter 100 as shown in FIG. 5, to provide negative over-current protection. Alternatively, the protection circuit may be used with other types of DC-DC converters. The current sensor 520 may be adapted depending on the application and the type of converter being used. For example, when using the protection circuit with a buck converter, the negative supply of the low side power switch and the current sensor would be changed to ground. Considering another example in which the protection circuit is used to protect the high side power switch, then the current sensor would have the node E connected to the high-side power switch, the node F and Vreg connected to Vsys, and node D connected to ground.

The optional slope detector 560, also referred to as slope detector and accelerator SDA, has an input coupled to the level shifter 540 and an output coupled to the current comparator 550. The slope-detector 560 is adapted to detect a slope of the current at the switching node LX and adjust the reference current based on the slope. Referring to FIG. 3, it can be observed that between the times T5 and T6 the current IL is identical to ILS.

The slope detector 560 permits to increase the response of the protection circuit by compensating the comparator delay through adjusting the reference current. This is achieved without increasing energy consumption and without increasing the size of the protection circuit.

Figure 6:
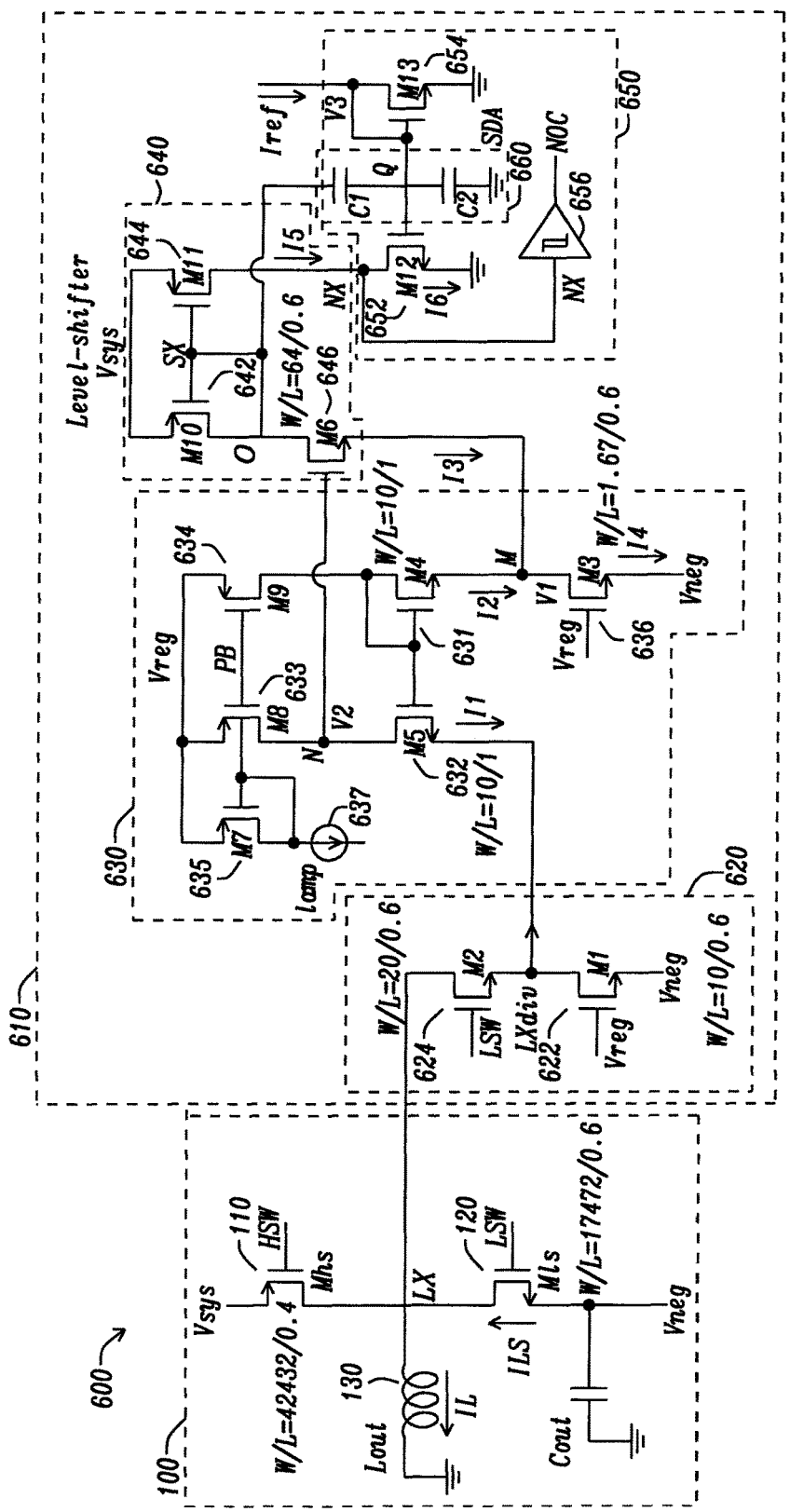
FIG. 6 is an exemplary embodiment of the protection circuit of FIG. 5.

FIG. 6 illustrates an exemplary embodiment of a protection circuit 610. In this example, the sensing circuit 620, comprises a first switch M1 622 coupled to a second switch M2 624 via a node LXdiv. The first switch M1 has a first terminal coupled to LXdiv and a second terminal coupled to the inverting output Vneg. The second switch M2 has a first terminal coupled to the switching node LX of the inverting boost converter 100 and a second terminal coupled to LXdiv. The aspect ratio of the first switch and the aspect ratio of the second switch can be adjusted. In this embodiment, the aspect ratio of the second switch is twice as large as the aspect ratio of the first switch.

The sensing circuit 620 lowers the impedance at node LXdiv, hence the converter 630 is coupled to a low impedance input. The sensing circuit 620 being of low impedance, it permits for fast sensing of the inductor current.

The converter 630, also referred to as conveyor circuit, includes a first current mirror formed by switches M4 631 and M5 632; and a second current mirror formed by switched M8 633 and M9 634. The first current mirror is coupled to the second current mirror via a node N connecting M5 632 and M8 633. The switch M5 632 has a first terminal coupled to the node LXdiv of the current sensor 620, and a second terminal coupled to the node N. The switch M4 631 has a first terminal coupled to switch M9 634 and a second terminal coupled to another switch M3 636. An additional switch M7 635 has a first terminal coupled to a current generator 637. The switch M7 is coupled to the second current mirror such that a source of M7 is coupled to a source of M8 and M9. A gate of M7 is coupled to the gate common to both M8 and M9. The voltage and current converter 630 is coupled to the level-shifter 640.

The level-shifter 640 includes a current mirror formed by switches M10 642 and M11 644. The transistor M10 has a first terminal coupled to another switch M6 646 via node O, and a second terminal coupled to the source terminal of switch M11 644. In this example the second terminal is a source terminal coupled to the positive voltage Vsys. A gate of switch M10 is coupled to a gate of switch M11 via a node SX. The node O is coupled to the node SX. The switch M6 646 has a gate coupled to the node N and a source coupled to node M of circuit 630. The level-shifter 640 is coupled to a current comparator 650.

The current comparator 650 includes a current mirror coupled to a comparator with hysteresis, in this case a Schmitt trigger buffer 656. The current mirror is formed by switches M12 652 and M13 654. The switch M12 652 has a first terminal coupled to transistor M11 644 via a node NX. The switch M13 has a first terminal coupled to a current generator, not shown, for providing a reference current Iref, and a second terminal coupled to ground. The Schmitt trigger buffer 656 has an input coupled to node NX and an output for providing a logic signal, referred to as NOC signal. A slope detector and accelerator SDA 660 has an input coupled to the level-shifter 640 and an output coupled to the current comparator 650. The SDA is formed of a first capacitor C1 coupled in series with a second capacitor C2 at a node Q. The capacitor C1 has a first terminal coupled to the node SX and a second terminal coupled to the node Q. The capacitor C2 has a first terminal coupled to the node Q and a second terminal coupled to a ground. The node Q is coupled to the gate of switch M12 652 and to the gate of switch M13 654. The SDA circuit 660 can be adjusted for different operating condition by tuning the value of capacitor C2. For example, C2 can be an array of unit capacitors in which each unit capacitor is connected to ground through a switch, such as an NMOS switch, controlled digitally.

FIG. 6 provides example values of aspect ratios W/L for the switches M1-M6, as well as for the high-side and low side power switches of the switching converter. In this example, the switches M1 622, M2 624, and M3 636, are of the same type as the low-side switch Mls 120 of converter 100. For example, M1, M2, M3, and Mls are all N type transistors.

In operation, a voltage regulator (not shown) generates a voltage Vreg. The voltage Vreg is higher than the inverting output voltage Vneg. For example, Vreg may be 5V higher than Vneg. The low-side power switch gate control signal LSW 220 varies between Vneg and Vreg.

The gate of switch M1 622 receives the voltage Vreg, and the source of switch M1 receives the voltage Vneg. As a result, the switch M1 is always fully turned on. The switch M3 636 is connected to voltages Vreg and Vneg in a similar fashion as switch M1. Hence, the switch M3 636 is also always fully turned on.

In use, the current generator 637 generates a current Iamp. A current I1 passes through the switch M5 632 and a current I2 passes through the switch M4 631. The ratio between Iamp and I1 equals the aspect ratio between the transistors M7 and M8. The current I1 is the same as the current I2. In this circuit the current I1 is small, for example I1 may be 4 µA. The voltage Vsensor at node LXdiv may be about 5 µV when M2 switches off.

When the high-side switch Mhs turns on, the gate signals HSW 210 and LSW 220 swing low. Hence at this time both the low-side switch Mls and the switch M2 624 turn off. The voltage at node LX is pulled to Vsys by the high-side power switch. Since the current I1 is small, the voltage Vsensor at node LXdiv is pulled to Vneg by switch M1. The role of the switch M2 624 is to isolate the switch M5 from the high voltage at node LX. Also, any high frequency noise coupled from LX to LXdiv can be suppressed by M1. Since M1 is turned on, its channel can discharge the noise current within the frequency range of the protection circuit. The loop formed by the switches M3, M4, M5, M6, M8, and M9 is used to regulate the voltage Vsensor_mir also labelled V1 at node M, such that V1 is the same as the voltage Vsensor at node LXdiv.

When Mls turns on, HSW and LSW swings high. Now, M2 turns on and the voltage Vsensor at the node LXdiv is equal to the voltage at the switching mode LX divided by a ratio that is determined by the channel resistances of M1 and M2. In other words, M1 and M2 form a voltage divider. For example, if the voltage at LX is Vneg+200 mV, then the voltage at LXdiv will be about Vneg+133 mV based on the aspect ratios of switches M1 and M2. As a result, the voltage at LXdiv is greater than V1, since before Mls turning on, V1 is regulated to a voltage close to Vneg.

Therefore, the source voltage of the switch M5 is larger than that of the switch M4. Since M4 and M5 have the same gate drive, higher source voltage of M5 implies that the gate to source voltage Vgs5 of M5 is smaller than the Vgs4 of M4. Hence, M5 is not able to fully conduct the current I1 and the remainder of I1 will pull up the voltage V2 at node N. As the voltage V2 increases, the gate to source voltage Vgs6 of M6 increases, therefore increasing the driving capability of M6. A current I3 passing through M6 increases, hence augmenting the voltage V1 at node M until V1 reaches a value close or equal to the voltage at node LXdiv. In this example, the sensing current I3 is proportional to the drain current of the low-side power switch. The current I3 that is required to pull V1 to the voltage at node LXdiv (for example Vneg+133 mV) can be calculated by the aspect ratios of Mls, M1, M2, and M3. These switches are all operated in the Vneg domain. In other words, the current I3 is the sensing current in the Vneg domain. The current I3 is then transformed into the current I5 by current mode level shifter 640 formed by the switches M6, M10 and M11. The current I5 is the sensing current in the Vsys domain.

The current comparator 650 compares the current I5 with an adjustable reference current I6 passing through M12. The reference current I6 is proportional to another reference current Iref passing through the transistor M13, generated by a current generator (not shown). The current Iref is proportional to a negative threshold value that ILS should not exceed, referred to as over-current threshold Ith. Hence I6 is also proportional to the threshold current Ith. If I5 is larger than I6, then the voltage at node NX will increase and the Schmitt trigger buffer 656 will provide a NOC signal.

When ILS drops rapidly and reaches the over-current threshold, the NOC signal cannot be triggered instantly because there is a propagation delay between the node LX and the node NX. Such a propagation delay may cause a NOC error. For example, if Vneg equals −6V and Lout has a value of 1.2 µH, then, a 10 ns delay will cause a 50 mA error. That is, if the NOC threshold is −500 mA, the NOC signal will not be triggered when ILS reaches −500 mA, but instead when ILS reaches −550 mA, resulting in an error rate of 10%.

Figure 10:
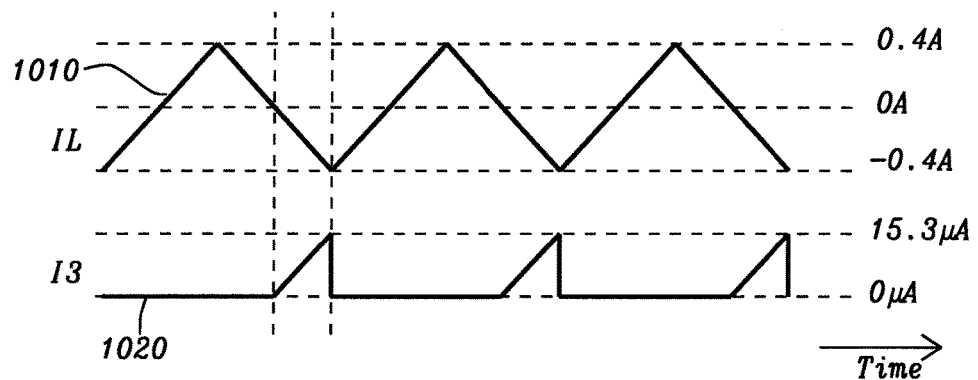
FIG. 10 is a time chart illustrating the waveforms of an inductor current and a sensing current.

In a traditional voltage-mode comparator, response speed is improved by increasing the operating current which reduces efficiency. The current-mode comparator 650 is adapted to reduce the propagation delay by increasing the sensing current. This approach only increases energy consumption by a small amount. FIG. 10 below provides some numerical values for the sensing current I3.

At negative over-current, the slew rate at node NX depends on the difference between the currents I5 and I6. If the sensing current I3 increases, then the slew rate at node NX will also increase and the NOC delay will decrease. However, increasing I3 requires increasing the size of transistors M10 and M11, hence driving more parasitic capacitors. Also, increasing I3 does not reduce the delay for signals propagating from node LXdiv to node M.

To remedy this problem, a slope detector and accelerator SAD 660 is used. The slope detector 660 detects the slew rate (slope) of the voltage at the node SX. Then, this information is used to adjust the reference current I6.

When ILS decreases rapidly toward negative values, then the voltage at LX increases and the current I3 increases. As a result, the voltage at node SX decreases rapidly. The node SX is coupled to the node Q via capacitor C1; therefore, a drop of voltage at node SX results in a drop of voltage V3 at node Q. As a result, the reference current I6 is decreased. Hence the NOC threshold is also decreased. For example, let's consider an inductor current IL having an initial value of −1 A and a current I6 having a value of 10 µA. If IL drops from −1 A to −2 A with a slope of −1 A/ms, then I6 will decrease to a lower value, for example 9 µA. If IL drops further from −2 A to −3 A with a steeper slope of −2 A/ms, then I6 will decrease to a lower value, for instance 80.

Reverting to the pervious example, the NOC trigger point is 10% larger than the target value due to the 10 ns delay. The capacitors C1 and C2 can be designed such that the NOC threshold drops by 10% to −450 mA during transient, in this case the 10% error caused by the delay will be compensated and the NOC signal will be triggered when IL reaches −500 mA.

Figure 7:
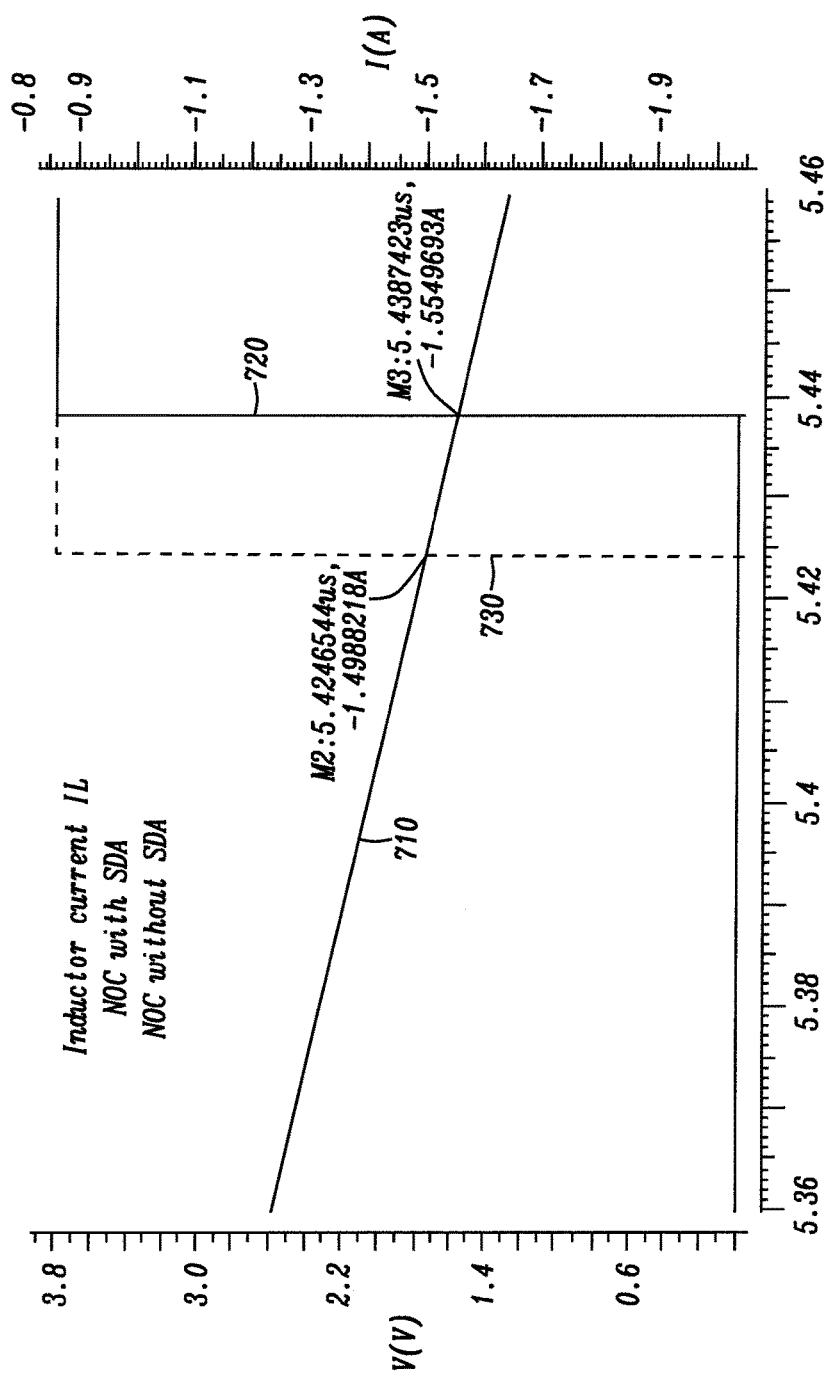
FIG. 7 is a simulation of a negative over-current protection signal.

FIG. 7 illustrates the simulated waveforms of an inductor current IL 710, a NOC logic signal provided by a protection circuit without SDA 720 and a NOC logic signal provided by a protection circuit with SDA 730.

The simulation was performed using the following parameters values: Vneg=−6V, Vsys=3.8V, Lout=1.5 µH. The NOC threshold was chosen equal to −1.495 A (DC). Therefore, if there were no delay, the NOC signal should be triggered in transient when IL reaches −1.495 A. However due to the delay, the NOC without SDA 720 is triggered at a lower value, in this case when IL reaches −1.555 A. For this example, the NOC error is about 60 mA. On the other hand, the NOC signal with SDA 730 is triggered close to the NOC threshold, in this case when IL reaches −1.499 A. In this instance, the NOC error is only about 4 mA. The SDA is also robust against corner variations.

FIGS. 8a, 8b and 8c illustrate the simulated NOC performance under different operating conditions with Monte Carlo sampling. The simulation was performed using the following parameters values: Vneg=−6V; temperature=−40° C., 125° C.; Vsys=2.9V, 5V; Lout=1.2 pH, 1.8 pH; NOC target=−1.5 A.

FIG. 8a lists the variations in NOC DC threshold values obtained with SDA and without SDA. It is observed that the NOC DC threshold (NOC_DC) minimum values and maximum values remain identical regardless of whether SDA has been implemented or not.

FIG. 8b lists the variations in NOC transient values obtained with SDA and without SDA. By comparing the NOC transient threshold (NOC_Tran) mean value with the NOC_DC mean value it can be observed that these values differ by −13.1%~+14.5% (with SDA) and +7.7%~+20.9% (without SDA). Therefore, the maximum NOC error with SDA is about 30.6% (1−14.5/20.9=0.306) smaller than that without SDA. This implies that the SDA centers the distribution of NOCTran around the mean value of NOC_DC.

FIG. 8c lists the NOC delays obtained with and without SDA. In FIGS. 9a, 9b and 9c, the SDA is adjusted such that the mean value of NOC_Tran is close to that of NOC_DC; resulting in a minimum delay being negative. The maximum NOC delay with and without SDA are 12 ns and 24.1 ns, respectively. This implies that with SDA, one can expect a 50% reduction in the maximum NOC error caused by delay. The minimum NOC delay with SDA is −9.7 ns. Negative delay time implies that in transient, NOC triggers before the inductor current reaches the NOC DC target. In case of system malfunction leading to a sudden drop in the inductor current, the protection circuit can be used to dynamically reduce the current limit threshold and prevent damage.

FIGS. 9a, 9b and 9c show another simulation of NOC threshold values obtained for a smaller absolute threshold value. In this case the NOC target is about −0.6 A instead of about −1.5 A. The simulation was performed using the following parameters values: Vneg=−6V; temperature=−40° C., 125° C.; Vsys=2.9V, 5V; Lout=1.2 µH, 1.8 µH. In FIG. 9 the SDA is adjusted such that the mean value of NOC_Tran is close to that of NOC_DC; resulting in a minimum delay being negative. The benefits of SDA are still observable. By comparing FIGS. 9a, 9b, 9c and 8a, 8b, 8c, it can be observed that the 3-sigma value increases with decreasing NOC target. This is because when the NOC signal triggers at low value, the drain to source voltages Vds of M1 and M3 are small. Since Vds of M1 and M3 are the inputs of M4 and M5, small Vds of M1 and M3 implies that the conveyor is sensitive to the mismatch of the gate to source voltage Vgs between M4 and M5. This can be addressed by increasing the aspect ratio of M2 and decreasing the aspect ratio of M1. Simulation shows that if the aspect ratio of M2 is 10 times larger than that of M1, one can expect a 3-sigma smaller than 10%. Further reduction in 3-sigma can be achieved by trimming the current Iref.

FIG. 10 illustrates the waveforms of inductor current IL 1010 and the sensing current I3 1020, when the inverting converter operates under no-load and continuous conduction mode. When the inverting converter operates under no-load case in continuous conduction mode, the inductor current IL has a triangular waveform 1010 centered around 0 A. The sensing current I3 1020 is positive only if the following two conditions are met: 1. IL<0; 2. M2 turns on. Therefore, I3 is positive for only one quarter of each cycle. The quiescent current of the protection circuit of FIG. 6 depends mostly on the sensing current I3. Therefore, in normal operation where IL is far away from the NOC threshold, the quiescent current is very small. In the example of FIG. 10, the mean value of I3 is 15.3 µA/8=1.9 µA, and the average total current (excluding that consumed by Mhs, Mls, M1 and M2) consumed in the protection circuit is about 20 µA.

FIGS. 11a, 11b and 11c show the results of another simulation of NOC threshold values. In this case, the SDA is adjusted such that the minimum delay is close to zero. The value of the capacitor C2 is chosen to reduce the delay. In this example, the capacitor C2=0.85 pF; the minimum delay with SDA is −0.17 ns, and the maximum delay with SDA is 14.2 ns. The maximum delay with SDA is 35% smaller than the delay without SDA. The simulation was performed using the following parameters values: Vneg=−6V; temperature=−40° C., 125° C.; Vsys=2.9V, 5V; Lout=1.2 µH, 1.8 µH, NOC target=−0.6 A. In FIG. 6, the capacitors C1 and C2 may be implemented with MIM capacitors which can be placed on top of other circuits in layout. Moreover, C1 and C2 consume no DC current. Therefore, the SDA reduces the comparator delay by 35% with no cost on silicon area and power consumption.

A skilled person will appreciate that variations of the disclosed arrangements are possible without departing from the disclosure. For example, although the protection circuit has been described in combination with an inverting boost converter, such a protection circuit could be used with other types of DC-DC converters including buck and buck boost converters. Accordingly, the above description of the specific embodiment is made by way of example only and not for the purposes of limitation. It will be clear to the skilled person that minor modifications may be made without significant changes to the operation described.

What is claimed is:

1. A current protection circuit for use with a switching converter comprising an energy-storing element coupled to a power switch via a switching node, the protection circuit comprising
   a current sensor adapted to sense a current at the switching node and to convert the current into a voltage;
   a converter adapted to convert the voltage into a first current associated with a first domain;
   a level shifter coupled to the converter; the level shifter being adapted to convert the first current into a second current associated with a second domain;
   a current comparator adapted to compare the second current with a reference current and to provide a logic signal based on the comparison.

2. The current protection circuit as claimed in claim 1, wherein the reference current is proportional to a threshold current through the power switch.

3. The current protection circuit as claimed in claim 1, wherein the first domain is a negative domain, and wherein the second domain is a positive domain.

4. The current protection circuit as claimed in claim 1, comprising a regulator coupled to the current sensor and to the converter.

5. The current protection circuit as claimed in claim 1 comprising a slope-detector adapted to detect a slope of the current at the switching node and adjust the reference current based on the slope.

6. The current protection circuit as claimed in claim 5, wherein the slope detector is adapted to detect the slope of the current at the switching node by detecting a variation of the first current.

7. The current protection circuit as claimed in claim 5, wherein the slope detector is adapted to decrease the reference current when the slope is negative and to increase the reference current when the slope is positive.

8. The current protection circuit as claimed in claim 1 wherein the current sensor comprises a first switch coupled to a second switch; wherein the second switch is coupled to the switching node and wherein the first switch is coupled to the first domain.

9. The current protection circuit as claimed in claim 8 wherein the second switch has an aspect ratio that is larger than an aspect ratio of the first switch.

10. The current protection circuit as claimed in claim 1, wherein the converter is adapted to provide a mirror voltage and to dynamically maintain the mirror voltage substantially identical to the voltage provided by the current sensor.

11. The current protection circuit as claimed in claim 1, wherein the converter comprises a first current mirror coupled to a second current mirror; wherein the first current mirror comprises a first switch coupled to the current sensor and a second switch coupled to the level shifter via a third switch.

12. The current protection circuit as claimed in claim 5, wherein the level shifter comprises a first current mirror, and wherein the current comparator comprises a second current mirror, and wherein the slope detector is adapted to adjust the reference current by controlling a gate voltage of the second current mirror based on a gate voltage of the first current mirror.

13. The current protection circuit as claimed in claim 12, wherein the first current mirror comprises a first switch coupled to the converter via a fourth switch, and a second switch coupled to the current comparator.

14. The current protection circuit as claimed in claim 12 wherein the current comparator comprises a comparator with hysteresis coupled to the second current mirror; wherein the second current mirror comprises a first switch coupled to the comparator with hysteresis and a second switch coupled to a current generator.

15. The current protection circuit as claimed in claim 5 wherein the slope-detector comprises a first capacitive element coupled to a second capacitive element.

16. The current protection circuit as claimed in claim 12, wherein the slope-detector comprises a first capacitive element coupled to a second capacitive element; and wherein the first capacitive element has a first terminal coupled to a gate of the first current mirror and a second terminal is coupled to a gate of the second current mirror.

17. The current protection circuit as claimed in claim 16, wherein the second capacitive element comprises an array of unit capacitors in which each unit capacitor is connected to ground through a switch.

18. A power circuit comprising
   a switching converter comprising an energy-storing element coupled to a power switch via a switching node; and
   a current protection circuit coupled to the switching converter, the current protection circuit comprising
      a current sensor adapted to sense a current at the switching node and to convert the current into a voltage;
      a converter adapted to convert the voltage into a first current associated with a first domain;
      a level shifter coupled to the converter, the level shifter being adapted to convert the first current into a second current associated with a second domain; and
      a current comparator adapted to compare the second current with a reference current and to provide a logic signal based on the comparison.

19. A method of protecting a switching converter from an over-current, the switching converter comprising an energy-storing element coupled to a power switch via a switching node, the method comprising
   sensing a current at the switching node;
   converting the current at the switching node into a voltage;
   converting the voltage into a first current associated with a first domain;
   converting the first current into a second current associated with a second domain;
   comparing the second current with a reference current and providing a logic signal based on the comparison to protect the switching converter.

20. The method as claimed in claim 19, wherein the first domain is a negative domain, and wherein the second domain is a positive domain.

21. The method as claimed in claim 19, comprising detecting a slope of the current at the switching node and adjusting the reference current based on the slope.

22. The method as claimed in claim 21, comprising detecting the slope of the current at the switching node by detecting a variation of the first current.

23. The method as claimed in claim 21, comprising decreasing the reference current when the slope is negative and increasing the reference current when the slope is positive.

* * * * *